United States Patent [19]

Mourier

[11] 4,214,187
[45] Jul. 22, 1980

[54] ION SOURCE PRODUCING A DENSE FLUX OF LOW ENERGY IONS

[75] Inventor: Georges Mourier, Paris, France

[73] Assignee: Thomson-CSF, Paris, France

[21] Appl. No.: 7,895

[22] Filed: Jan. 30, 1979

[30] Foreign Application Priority Data

Feb. 3, 1978 [FR] France .................. 78 03098

[51] Int. Cl.² .......................................... H01J 27/00
[52] U.S. Cl. ........................... 315/111.8; 250/423 R; 313/230; 313/362; 315/111.9
[58] Field of Search .................. 315/111, 111.8, 111.9, 315/344; 313/230, 231, 360, 362, 161; 250/423 R, 424, 427

[56] References Cited

U.S. PATENT DOCUMENTS 3,408,519 10/1968 Etievant et al. .................. 313/230 X
3,476,968 11/1969 Omura ........................... 313/230 X
3,999,072 12/1976 Takagi ........................... 315/111.9 X Primary Examiner—Eugene R. LaRoche
Attorney, Agent, or Firm—Roland Plottel

[57] ABSTRACT

An ion source supplying a dense flux of low energy ions containing very few neutral particles. It comprises: a microwave circuit in which an electromagnetic wave propagates along a direction ZZ, the conducting elements forming this circuit being arranged periodically and being ring-shaped, inlet means for a neutral gas at the center of the microwave circuit, this gas being ionized thanks to the energy supplied to it by the microwave, a magnetic field guiding the resulting plasma in the direction ZZ, and means for pumping the unionized atoms in a direction normal to the direction ZZ, all along the microwave circuit.

6 Claims, 3 Drawing Figures

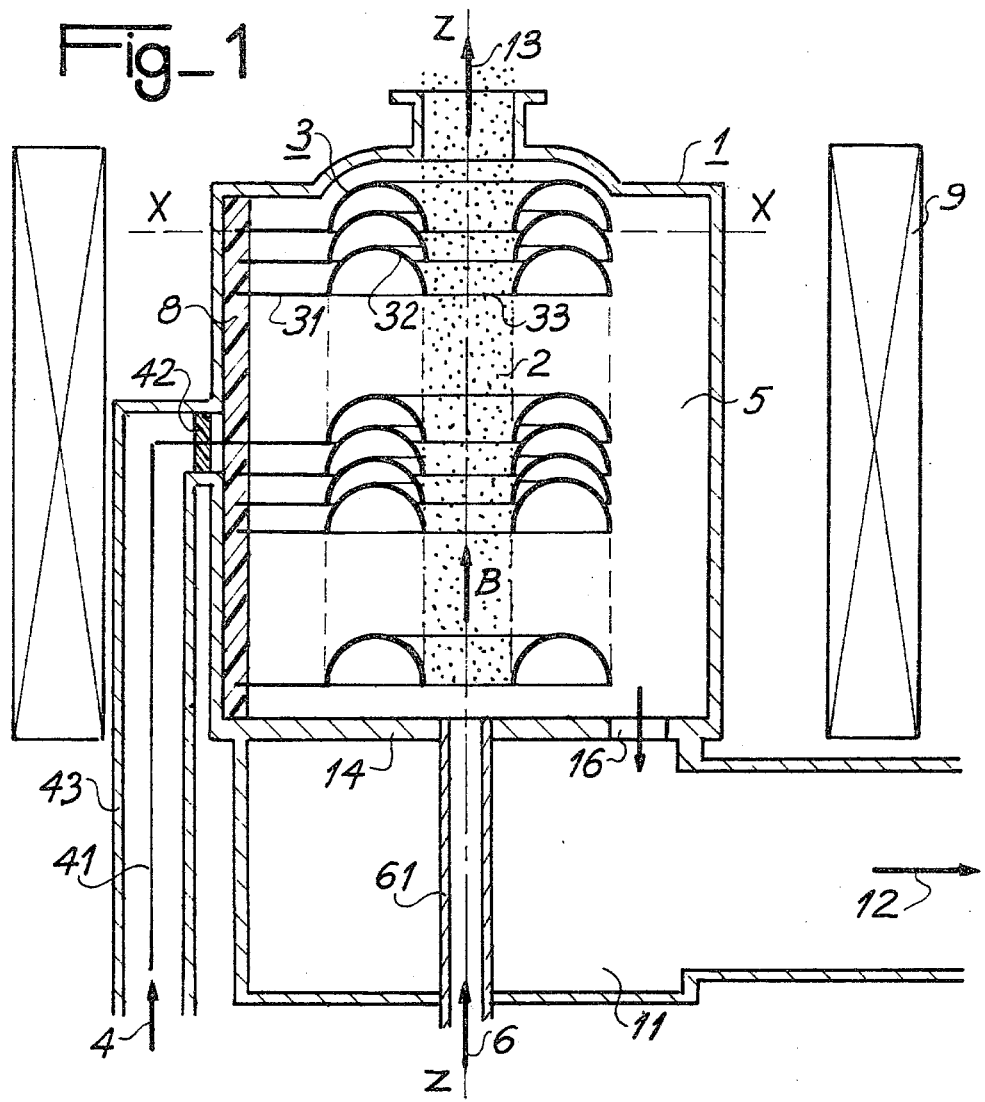
Fig_1
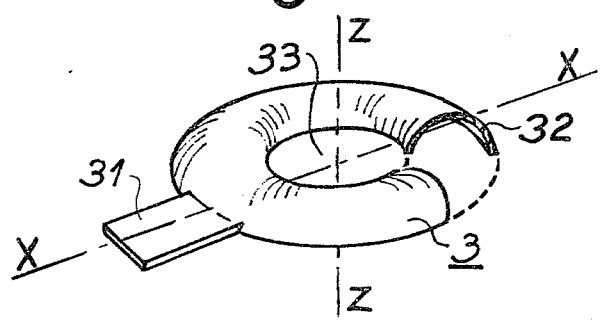
Fig_2

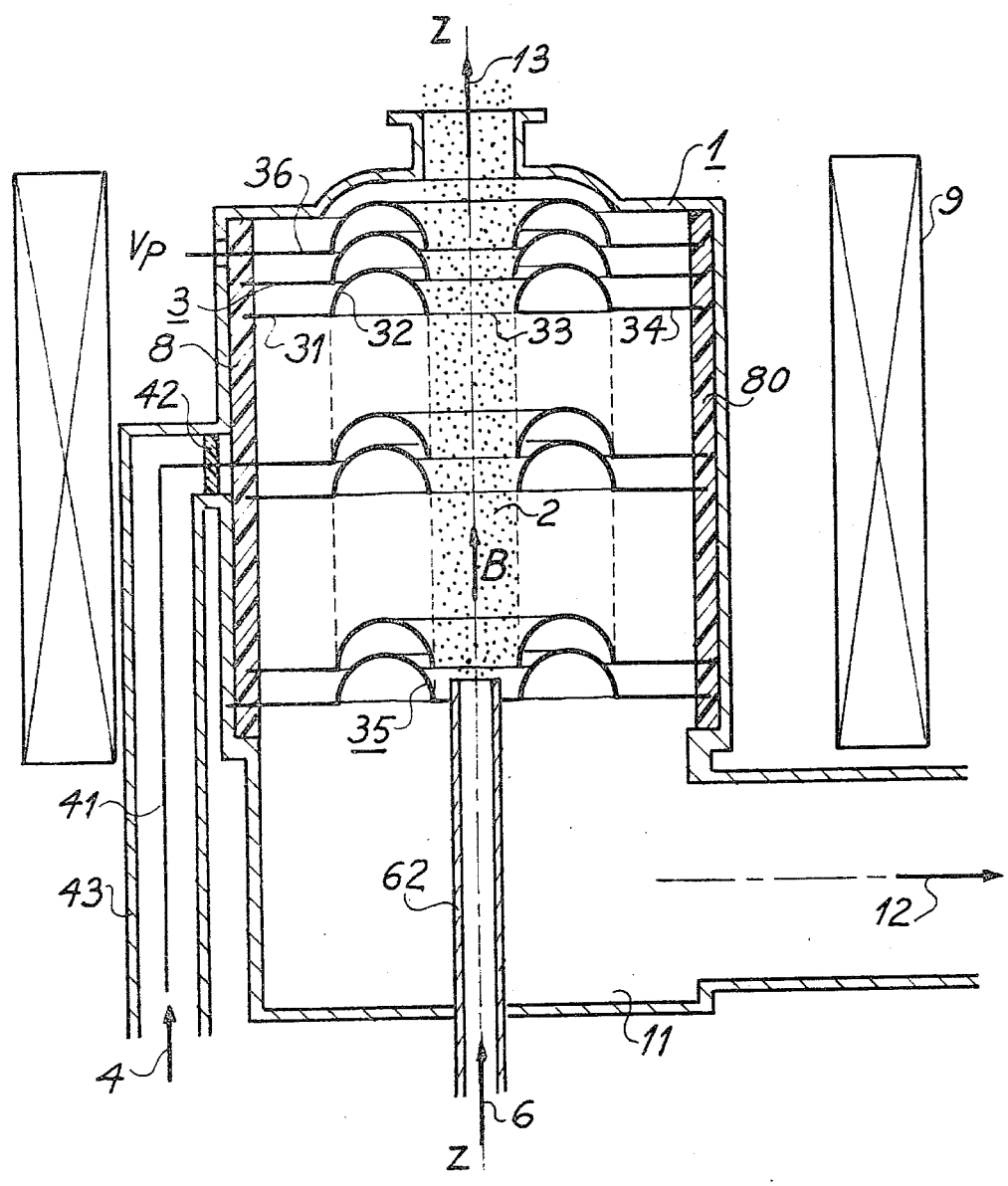

ION SOURCE PRODUCING A DENSE FLUX OF LOW ENERGY IONS

The present invention covers an ion source which uses the phenomenon of gaseous discharge under the action of an electromagnetic field and is able to supply a dense flux of low energy ions.

Low energy ion sources can be used in particular to make devices for treating solid surfaces which ions with higher energy would damage in depth or in certain chemical installations to carry out reactions on the ions. As the time during which the ions are in the enclosure where the reaction is to take place is inversely proportional to their velocity, the slower the ions, the greater the probability of reaction.

Also, as the ions are generally produced from a neutral gas only part of which is ionized, the ion flux is accompanied by neutral atoms. These are undesirable in many applications, either because of the interfering reactions (chemical reactions, ionizations or collisions) they may cause in the ion flux or because they are likely to attach themselves to the surface treated by the ion flux.

Also, for practical reasons, and economic ones in particular, these sources must supply big ion fluxes of some tens or hundreds of Amperes. It is then necessary to neutralize the electric charge of the ions with negative particles (the ionizing electrons for example) to prevent the ions diverging and being inapt to form a beam because of their low energy.

Finally, it is necessary to guide and accelerate the plasma in a particular direction to obtain the beam required.

The present invention covers an ion source satisfying these various requirements.

Accordingly, there is provided an ion source producing a dense fluz of low energy ions, comprising:

a vacuum enclosure, a microwave circuit placed in said vacuum enclosure, in which an electromagnetic wave is able to propagate along a direction ZZ, comprising generally ring-shaped conducting elements which are arranged periodically so as to be roughly centred on said direction ZZ, inlet means for a neutral gas at one end of said microwave circuit, said gas being at least partially ionized in the centre part on the rings by means of the energy given to it by said electromagnetic wave, thus forming a plasma, means for guiding said plasma along the direction ZZ, means for pumping remaining unionized atoms in a direction normal to ZZ along said microwave circuit.

For a better understanding of the invention and to show how it can be carried into effect, reference will be made to the description which follows and illustrated by the accompanying drawings which show:

in FIG. 1 a sectional view of an embodiment of an ion source in accordance with the invention, in FIG. 2 a perspective view of an embodiment of a conducting element in the microwave circuit used in the ion source in accordance with the invention, in FIG. 3 variant embodiments of FIG. 1.

In these various figures the same references refer to the same elements.

In FIG. 1 are shown:

a sealed metallic enclosure 1 with an entrance 6 for the unionized gas, an entrance 4 for the microwave energy, an outlet 13 for the ion beam and an outlet 12 for the unionized atoms, a microwave circuit placed inside enclosure 1 which is formed of electrically conductive elements 3, this circuit ensuring the propagation of an electromagnetic wave in a direction ZZ.

One embodiment of an element 3 of the microwave circuit is shown in FIG. 2. It is a metallic element generally of ring-shape, i.e. with a centre hole 33, the solid part 32 having preferably a section in the form of an arc of a circle (a half circle for example). This element 3 is fitted with at least one strip 31 which is also conducting.

Elements 3 are stacked in enclosure 1 in such a way that axis ZZ is an axis of symmetry for the ring part 32 of the said elements. They are fixed to enclosure 1, through an insulator 8 for example, by strips 31 which lie along a direction XX normal to ZZ. To make it easier to produce the device practically, it may be preferable to have several fixing strips such as 31 for each element 3. An embodiment of them with two strips is shown below (FIG. 3).

The strip 31 of at least one of elements 3 is extended outside enclosure 1 in order to form the centre conductor 41 of coaxial input 4, which consists of a metal tube 43 closed at the level of enclosure 1 by a sealed insulating plate 42.

Enclosure 1 has a lower part 11, which is separated from the microwave circuit by a plate 14 which has an opening 16 in it, an arc of a circle for example, on the side where a volume 5 is left free by the microwave circuit. Part 11 is connected by outlet 12 to a high output vacuum pump.

The inlet 6 of the unionized gas is through a tube 61, which passes through part 11 and plate 14 and opens out near the centre 33 of the first element 3 in the microwave circuit.

The device in accordance with the invention also has means for energizing a magnetic field B along ZZ, magnets or a solenoid 9.

In operation, the microwave energy is brought to input 4. The stack of elements 3 enables a wave to be guided in the direction ZZ and a corresponding electric field to be energized in the region of holes 33. The gas arriving at the level of these holes is ionized and forms a plasma 2 with the electrons.

Plasma 2 is guided by magnetic field B along axis ZZ. Field B limits the movement of charged particles, chiefly electrons, in directions normal to ZZ.

When, as shown in FIG. 1, elements 3 are fixed on an insulating part 8, they are raised to an electric potential close to that of the cylindrical cordon of plasma 2 and this varies along the axis. The ions of a plasma are characterized by a temperature $T_i$ and the electrons by a temperature $T_e$, which is higher than $T_i$. As the thermal agitation of the electrons is greater, they have a tendancy to form a negatively charged layer at the periphery of the plasma. The ions inside are then accelerated towards the plasma periphery. This is the known phenomenon of plasma expansion. The ions are then accelerated to outlet 13.

However this phenomenon of self-acceleration can be inadequate in practice and it is then preferable to fix the potential of certain of the elements 3 in the circuit in order to set up a given potential difference enabling the ions to be accelerated. The first element 3, which is beside gas inlet 6, may be connected to enclosure 1, which forms the electrical ground of the device. Also, one or more elements 3 distributed along ZZ may be connected to external voltage sources. This last variant embodiment may be replaced by an electrical polarizing of the target intended to receive the ion beam.

Finally, elements 3 of the microwave circuit leave a free volume in enclosre 1 (marked 5) through which the unionized atoms are pumped in a transverse direction with respect to the direction (ZZ) of beam 2, all along the circuit, between each pair of elements 3. As is known, pumping at several points is much more effective than pumping at only one point for a given pumping speed. This arrangement enables a sufficiently high gas pressure to be obtained at inlet 6 for ionizing of the gas to occur, the pressure decreasing rapidly to opening 13 where a beam is obtained in which neutral particles are very rare.

Also, the solid parts (32) of elements 3 are not plane in shape. Their shape is intended to make possible interception of the metallic atoms coming from elements 3 which are freed by the ion bombardment and so prevent these metallic atoms from being deposited on insulating parts such as 8. Evidently, the section of elements 3 in the shape of an arc of a circle is only shown in the figures as an example and any other shape allowing elements 3 to be stacked is acceptable, a triangular section for example.

As an example, in one embodiment of the invention, a diameter of the order of a centimeter for centre hole 33 in elements 3 and an overall diameter, strip 31 excluded, of a few centimeters, typically 3 cm, has been given. The space between elements 3 along axis ZZ was a few millimeters, typically 3 to 5 mm.

FIG. 3 shows variant embodiments of the source described in FIG. 1.

In FIG. 3 can be found:
enclosure 1,
its inlets 4 and 6,
its outlets 12 and 13,
magnetic coil 9.

The arrangement of enclosure 1 differs from that of FIG. 1 by the fact that lower part 11, which is connected to outlet 12 and to the pumping system, is no longer separated from the microwave circuit by a plate (14 in FIG. 1) in order to increase the pumping surface. This arrangement requires that the neutral gas feed tube, marked 62, be extended to inside the microwave circuit as shown in FIG. 3.

Also, elements 3 forming the microwave circuit each have a second strip 34 like 31, to enable them to be fixed to the opposite side of enclosure 1 through an insulating part 80.

Finally, as an example, the potential of the first element 3 (marked 35) has been fixed at that of the enclosure 1 and the potential of the last element 3 (marked 36) at that of an external polarizing voltage $V_P$.

Evidently, these variant embodiments of the device in FIG. 1 have been shown for convenience in the same figure but they may be made independantly one of another.

The present invention can be used in particular for treating solid surfaces. Enclosure 1, which forms an ion gun, is then fixed on another enclosure in which the surface to be treated is placed in the path of the ion beam.

What is claimed is:
1. An ion source producing a dense flux of low energy ions, comprising:
 a vacuum enclosure,
 a microwave circuit placed in said vacuum enclosure, in which an electromagnetic wave is able to propagate along a direction ZZ, comprising generally ring-shaped conducting elements which are arranged periodically so as to be roughly centred on said direction ZZ,
 inlet means for a neutral gas at one end of said microwave circuit, said gas being at least partially ionized in the centre part on the rings by means of the energy given to it by said electromagnetic wave, thus forming a plasma,
 means for guiding said plasma along the direction ZZ,
 means for pumping remaining unionized atoms in a direction normal to ZZ along said microwave circuit.
2. An ion source as in claim 1, wherein said conducting elements forming said microwave circuit have at least one electrically conducting strip for fixing them to said enclosure through an insulator.
3. An ion source as in claim 2, wherein said strips of at least two conducting elements extend outside said enclosure and are connected to external voltage sources.
4. An ion source as in claim 1, wherein each of said conducting elements forming said microwave circuit is not plane in shape.
5. An ion source as in claim 4, wherein the section of a half-element conductor is in the shape of an arc of a circle.
6. An ion source as in claim 1, wherein said means for guiding the plasma produce a magnetic field along said direction ZZ.

* * * * *